(12) United States Patent
Sramek et al.

(10) Patent No.: US 8,614,440 B2
(45) Date of Patent: Dec. 24, 2013

(54) MATERIAL FOR A PHOTOACTIVE LAYER IN ORGANIC PHOTODIODES, USE THEREFOR, AND AN ORGANIC PHOTODIODE

(75) Inventors: Maria Sramek, Erlangen (DE); Oliver Hayden, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/499,243

(22) PCT Filed: Sep. 28, 2010

(86) PCT No.: PCT/EP2010/064354
§ 371 (c)(1),
(2), (4) Date: Mar. 29, 2012

(87) PCT Pub. No.: WO2011/039182
PCT Pub. Date: Apr. 7, 2011

(65) Prior Publication Data
US 2012/0181527 A1    Jul. 19, 2012

(30) Foreign Application Priority Data

Sep. 29, 2009 (DE) .......................... 10 2009 043 348

(51) Int. Cl.
*H01L 51/00* (2006.01)
(52) U.S. Cl.
USPC  257/40; 257/436; 257/E51.014; 257/E51.017; 428/690; 564/428
(58) Field of Classification Search
USPC ................ 257/40, 436, E51.014, E51.017; 428/690; 564/428
See application file for complete search history.

(56) References Cited

U.S. PATENT DOCUMENTS

| 7,750,339 B2 | 7/2010 | Setayesh et al. | |
|---|---|---|---|
| 2007/0252129 A1* | 11/2007 | Yagi | 257/2 |
| 2008/0230123 A1 | 9/2008 | Mitsui et al. | |
| 2010/0065112 A1* | 3/2010 | Thompson et al. | 136/255 |

FOREIGN PATENT DOCUMENTS

| EP | 1970959 A2 | 9/2008 |
|---|---|---|
| GB | 2217724 A | 11/1989 |
| JP | 7-142751 | 6/1995 |
| JP | 2008-244296 | 10/2008 |
| WO | 2004/068609 A1 | 8/2004 |
| WO | 2010/031042 A1 | 3/2010 |

OTHER PUBLICATIONS

Edsger C.P. Smitts et al., "Near-Infrared Light-Emitting Ambipolar Organic Field-Effect Transistors", Advanced Materials, vol. 19, 2007, pp. 734-738.

Anthony Burke et al., "A novel blue dye for near-IR 'dye-sensitised' solar cell applications", Chemical Communications, 2007, pp. 234-236.

Fabio Silvestri et al., "Efficient Squaraine-Based Solution Processable Bulk-Heterojunction Solar Cells", Journal of the American Chemical Society, 2008, pp. 17640-17641.

(Continued)

*Primary Examiner* — Tu-Tu Ho
(74) *Attorney, Agent, or Firm* — Staas & Halsey LLP

(57) ABSTRACT

A photoactive layer in organic photodiodes includes organic photoactive dyes, including squaraines with donor-substituted aromatic substituents as the electron donor component, used as an alternative to polymer hold conductors for bulk heterojunctions typically found in the organic active layer of organic photodiodes.

4 Claims, 2 Drawing Sheets

(56) References Cited

OTHER PUBLICATIONS

Siyi Wang et al., "High efficiency organic photovoltaic cells based on a vapor deposited squarine donor", Applied Physics Letters, vol. 94, 2009, pp. 233304-1-233304-3.

Seok Hwan Hwang et al., "Absorption Spectra and Electrophotographic Properties of Squarylium Dyes Containing a Nitro Group", Dyes and Pigments, vol. 39, No. 4, 1998, pp. 359-369.

International Search Report mailed Feb. 9, 2011 issued in corresponding International Patent Application No. PCT/EP2010/064354.

Office Action dated Jun. 16, 2010 in corresponding German Patent Application No. 10 2009 043 348.1-33.

Office Action issued Sep. 3, 2013 in corresponding Japanese Application No. 2012-530291.

\* cited by examiner

MATERIAL FOR A PHOTOACTIVE LAYER IN ORGANIC PHOTODIODES, USE THEREFOR, AND AN ORGANIC PHOTODIODE

CROSS REFERENCE TO RELATED APPLICATIONS

This application is the U.S. national stage of International Application No. PCT/EP2010/064354, filed Sep. 28, 2010 and claims the benefit thereof. The International Application claims the benefit of German Application No. 10 2009 043 348.1 filed on Sep. 28, 2009, both applications are incorporated by reference herein in their entirety.

BACKGROUND

Described below is a novel material for the photoactive layer in organic photodiodes, to the use of the material and to an organic photodiode.

Organic photodiodes are known, for example, from EP 06792696.4. Disclosed therein are organic-based photodiodes built on a commercial transistor matrix with silicon-based transistors, as are commercially available inexpensively, as a substrate with the aid of a passivation layer. The organic photodiodes themselves include at least one first electrode layer on the substrate, an organic active layer thereon, on which a second electrode layer has been applied, and finally an encapsulation.

The known organic active layers include what is called an organic bulk heterojunction, which connects a hole conductor to an electron injection material.

These known photodiodes, however, are suitable only for the UV/VIS spectral range, and so there is a need to provide photodiodes which absorb higher wavelengths.

There is currently no efficient absorber for organic photodiodes in the near infrared range from 750 nm to 1000 nm on the market. This spectral range is of interest for optical industrial sensors among other applications.

Recently, the use of squaraines in organic solar cells was disclosed by three publications, one by Fabio Silvestri, Michael D. Irwin, Luca Beverina, Antonio Facchetti, Giorgio A. Pagani, and Tobin J. Marks; *J. Am. Chem. Soc.*, Article ASAP; available at pubs.acs.org on Dec. 16, 2008; with the title "Efficient Squaraine based Solution processable Bulk-Heterojunction Solar Cells"; another by Anthony Burke, Lukas Schmidt-Mende, Seigo Ho and Michael Grätzel; *Chem. Commun.*, 2007, 234-236 with the title "A novel blue dye for near-IR "dye-sensitised" solar cell applications" and finally a publication by Siyi Wang, Elizabeth I. Mayo, M. Dolores Perez, Laurent Griffe, Guodan Wei, Peter I. Djurovich, Stephen R. Forrest, Mark E. Thompson, APPLIED PHYSICS LETTERS 94, 233304, 2009 with the title "High efficiency organic photovoltaic cells based on a vapor deposited squaraine donor".

However, the use of the squaraines disclosed therein did not lead to the desired effect in organic photodiodes because either the quantum efficiencies in the wavelength spectrum above 700 nm of only an inadequate 20% showed that the dark currents are too high, or the wavelength ranges above 700 nm in question are not covered at all

SUMMARY

Therefore, described below is a material for a photoactive layer of an organic photodiode, which exhibits sufficiently high quantum efficiency in the wavelength range from 700 nm and low dark currents for a blocking voltage range of typically 1 to 10 V.

Accordingly, a material for a photoactive layer of an organic photodiode composed of a bulk heterojunction of an electron-accepting component and of an electron donor component includes a compound from the class of the squaraines with donor-substituted aromatic substituents as the electron donor component. Also described below is the use of such a material in an organic photodiode, and an organic photodiode having a substrate, a lower electrode, an organic bulk heterojunction, an upper electrode and finally an encapsulation.

Surprisingly, it has been possible to find squaraines which, in a bulk heterojunction, impair the dark current characteristics of the organic photodiode containing polymeric absorbers only insignificantly, if at all. This is all the more surprising in that the squaraines were considered to be unsuitable to date for photodiodes because they cause an excessively high dark current.

In an advantageous embodiment, the electron-donating component, i.e. the hole conductor or the electron donor component, is an azulene squaraine, i.e. a squaraine substituted on at least one side by an azulene (combination of an aromatic 5-membered with an aromatic 7-membered ring). The squaraine component may be a bisazulene squaraine, especially a squaraine of the structural formula I, bis (1,4-dimethyl-7-isopropylazulene)squaraine or bis(guaiazulene) squaraine.

Structure I: bisguaiazulene squaraine, SQ1

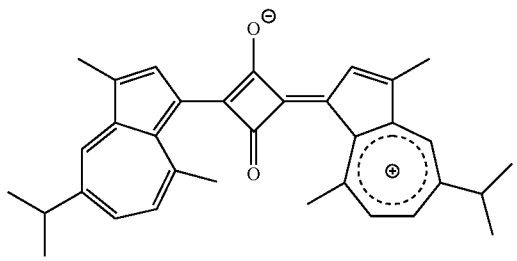

In a further embodiment, the electron donor component of the bulk heterojunction is a bis(2,6-dimethoxy-4-diheptylaminophenyl)squaraine of the structural formula II in conjunction with the squaraine base structure, as shown in structural formula III including mesomeric limiting structures.

$A_1$: an example of azulene

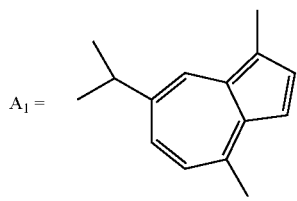

Structure II: examples of the aromatic squaraine substituents; A1 = guaiazulene or 1,4-dimethyl-7-isopropylazulene; A2 = 1,3-dimethoxy-5-diheptylaminobenzene

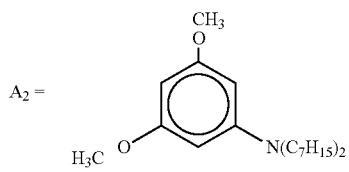

Structure III: general formula of the squaraines with all mesomeric limiting structures.

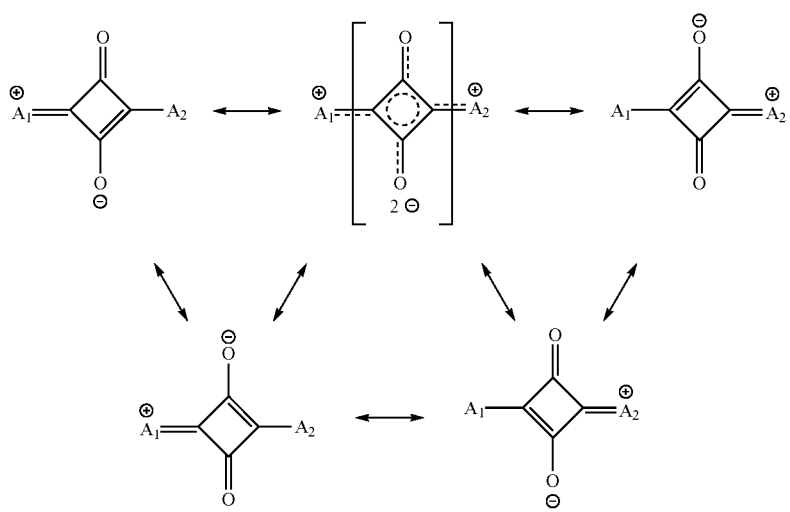

TABLE 1

Overview of the squaraines shown here

| Abbreviation | Substitution pattern | Name |
|---|---|---|
| SQ1 | A1 = A2 | Bisguaiazulene squaraine |
| SQ2 | A1, A2 | (Guaiazulene)(2,6-dimethoxy-4-diheptylaminophenyl)squaraine |
| SQ3 | A2 = A1 | Bis(2,6-dimethoxy-4-diheptylaminophenyl)squaraine |

The advantages of the squaraine compounds shown here compared to the known systems are firstly simple processability in the bulk heterojunction with, for example, PCBM as the electron acceptor, and in particular the long-wave absorption thereof. In organic photodiodes, to date, bulk heterojunctions have been produced using mixtures of semiconductive polymers, generally polythiophenes, as hole conductors together with fullerene derivatives such as PCBM as electron acceptors. The absorption range thereof is typically only in the visible range up to ~600 nm. A further disadvantage of semiconductive polymer absorbers is the limited thermal stability of these polymeric systems in the use range from −20° C. to 100° C., due to the morphology of polymers.

The squaraines of the structural formulae I and II shown were preparable in high yields in as yet unoptimized syntheses known from the literature. The obtainability of these systems is thus relatively good, which greatly increases the economic significance thereof with good performance. The synthesis is disclosed, for example, in the article by W. Ziegenbein et al. in Angew. Chemie, volume 78, 1966, page 937.

It has been found that (see FIG. 1), surprisingly, the squaraines with donor-substituted aromatic substituents, in the current/voltage characteristic of an organic photodiode, even after heating of the device to 100° C. for 10 min, are not inferior to the dark current characteristics of the known bulk heterojunctions with polymeric electron donors or hole conductors. Secondly, they have many advantages over these known systems, especially good processability, heat stability up to 200° C., and in particular good obtainability in high purity, which is obtainable in the case of the known polymeric hole conductors, such as the polymeric thiophenes, only with a high level of complexity and therefore at comparatively high cost.

The bulk heterojunctions using the squaraines with donor-substituted aromatic substituents exhibit a widened optical absorption in the wavelength range up to 1000 nm, as shown in FIG. 2.

BRIEF DESCRIPTION OF THE DRAWINGS

These and other aspects and advantages will become more apparent and more readily appreciated from the following description of the exemplary embodiments, taken in conjunction with the accompanying drawings of test results in FIGS. 1 to 3; specifically.

DETAILED DESCRIPTION OF THE PREFERRED EMBODIMENT

Figure 1:
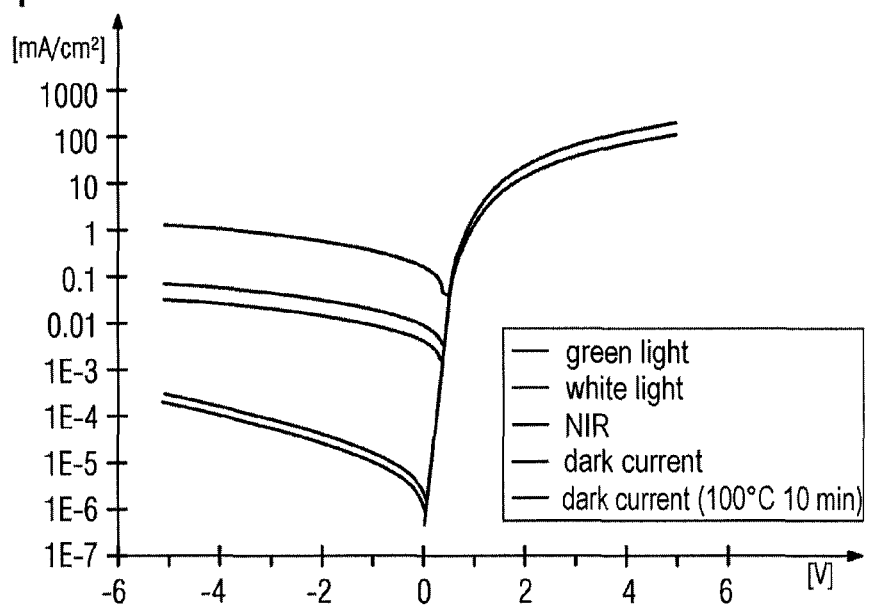
FIG. 1 is a graph of a current-voltage curve

Reference will now be made in detail to the preferred embodiments, examples of which are illustrated in the accompanying drawings, wherein like reference numerals refer to like elements throughout.

Figure 4:
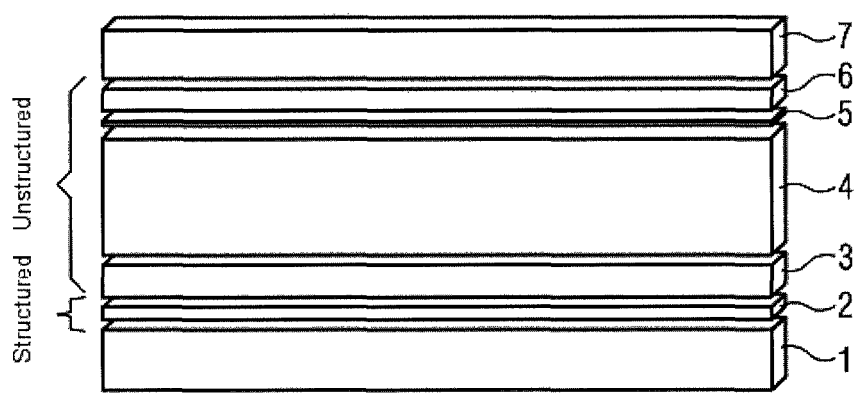
FIG. 4 is a perspective schematic view of the structure of an organic photodiode.

FIG. 1 shows the current/voltage characteristic of an organic photodiode according to the scheme in FIG. 4, with Pedot:PSS as an interlayer and/or intermediate layer and PCBM/squaraine I bis(1,4-dimethyl-7-isopropylazulene) squaraine as a bulk heterojunction. The dark blue curve shows an almost unchanged dark current after thermal stress at 100° C. for 10 min.

Figure 2:
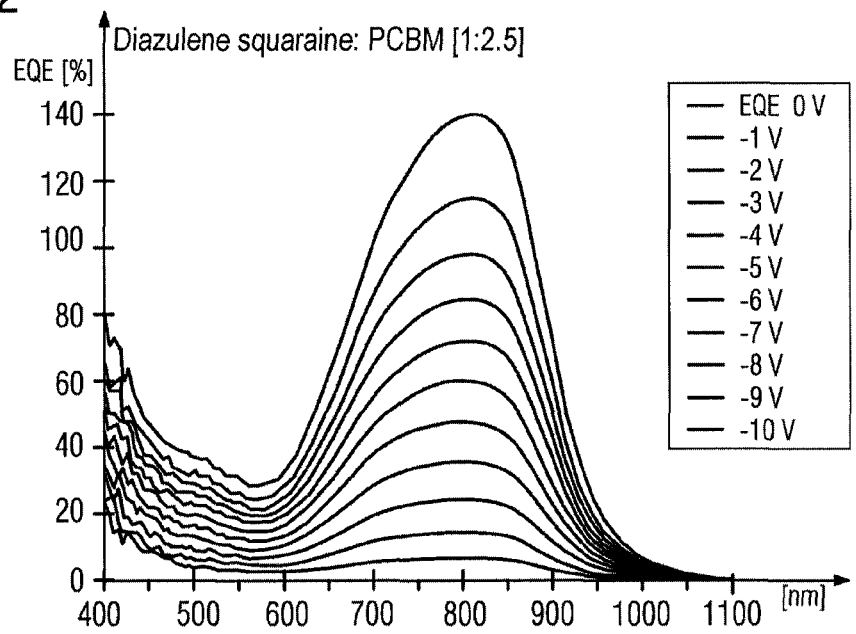
FIG. 2 is a graph of the measurement of the external quantum efficiency

FIG. 2 shows the external quantum efficiency of a bulk heterojunction composed of squaraine I bis(1,4-dimethyl-7-isopropylazulene)squaraine and PCBM as an electron acceptor. The maximum at 810 nm is evident.

Figure 3:
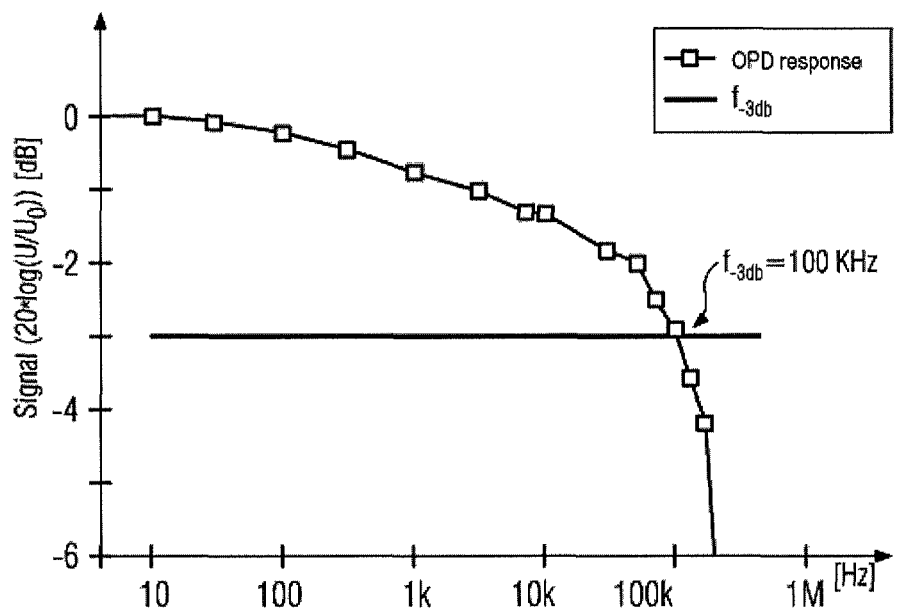
FIG. 3 is a graph of the response characteristics of the photodiode.

Finally, FIG. 3 shows the transient behavior of a bulk heterojunction composed of squaraine I bis(1,4-dimethyl-7-isopropylazulene)squaraine and PCBM. The limiting frequency at −2V should be noted: $f_{-3dB}=100$ KHz (−5V: $f_{-3dB}=110$ KHz).

The production of organic photodiodes and consequently of photodetectors is conducted in a relatively simple manner as a stack of different, usually unstructured layers on a substrate 1. On a substrate 1 is disposed a lower electrode layer 2, which may either be structured or unstructured. The lower transparent electrode 2 is composed, for example, of ITO, an indium tin oxide, which is transparent and constitutes, for example, the anode. Applied thereon in an unstructured manner is an intermediate layer 3, for example of PEDOT/PSS. This is followed by the organic active layer 4, which includes the bulk heterojunction. On the active layer 4 is applied another thin intermediate layer 5, for example calcium. This is followed by the upper electrode 6 which is, for example, semitransparent and/or composed of silver, and deposited thereon is a protective layer such as the encapsulation 7, which may be transparent, semitransparent or nontransparent, and may be composed, for example, of glass, metal or a polymer or a laminate of these components.

The unstructured layers can be produced over an area by all standard coating methods, such as spraying, spin-coating, dipping, coating bar or printing techniques, etc. The structured layers may be applied from solution by printing methods.

By virtue of what is disclosed here, it is possible for the first time to replace polymers such as poly(2-methoxy-5-(2'-ethylhexyloxy)-1,4-phenylenevinylene) (MEH-PPV) and/or poly-3-hexylthiophene (P3HT) as an electron donor in a bulk heterojunction, and especially the fullerene derivative (6,6)-phenyl-$C_{61}$-butyric acid methyl ester (PCBM) as an electron acceptor in a bulk heterojunction of a photoactive organic layer of a photodiode.

For the first time, organic photodiodes with peak sensitivities in the region of 800 nm have been described. This is of particular interest, since the known photodiodes on the market have photodetectors based on silicon for industrial applications in the spectral range of wavelength<1 μm. The disadvantages of the silicon-based technology are the associated high costs and complex production in the case of large-surface area applications for lens-free applications.

The organic photoactive dyes which include squaraines with donor-substituted aromatic substituents as the electron donor component are an alternative to polymeric hole conductors for bulk heterojunctions as materials for the organic active layer in organic photodiodes.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A material for a photoactive layer of an organic photodiode composed of a bulk heterojunction of an electron-accepting component and of an electron donor component, comprising:
a compound selected from the group consisting of a (guaiazulene)(2,6-dimethoxy-4-diheptylaminophenyl) squaraine and a bis(2,6-dimethoxy-4-diheptylaminophenyl)squaraine.

2. The material as claimed in claim 1, wherein the compound is an azulene squaraine.

3. The material as claimed in claim 2, wherein the compound is a bisguaiazulene squaraine according to the structural formula

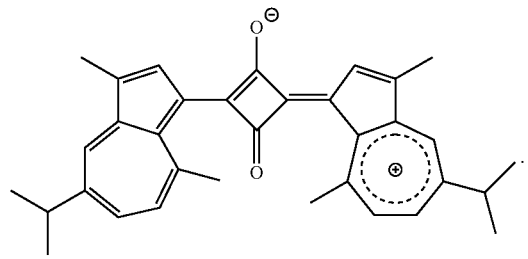

4. An organic photodiode, comprising:
a substrate;
a lower electrode;
an organic bulk heterojunction with a squaraine with donor-substituted aromatic substituents as an electron donor component, the squaraine selected from the group consisting of a (guaiazulene)(2,6-dimethoxy-4-diheptylaminophenyl)squaraine and a bis (2,6-dimethoxy-4-diheptylaminophenyl)squaraine;
an upper electrode; and
an encapsulation.

* * * * *